United States Patent
Wang et al.

(10) Patent No.: US 10,276,553 B2
(45) Date of Patent: Apr. 30, 2019

(54) CHIP PACKAGE STRUCTURE AND MANUFACTURING METHOD THEREOF

(71) Applicant: Powertech Technology Inc., Hsinchu County (TW)

(72) Inventors: Chi-An Wang, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 15 days.

(21) Appl. No.: 15/787,712

(22) Filed: Oct. 19, 2017

(65) Prior Publication Data
US 2018/0114783 A1    Apr. 26, 2018

Related U.S. Application Data

(60) Provisional application No. 62/410,851, filed on Oct. 21, 2016.

(51) Int. Cl.
*H01L 25/00* (2006.01)
*H01L 23/053* (2006.01)
(Continued)

(52) U.S. Cl.
CPC ............ *H01L 25/50* (2013.01); *H01L 21/486* (2013.01); *H01L 21/4853* (2013.01);
(Continued)

(58) Field of Classification Search
CPC ............. H01L 21/0463; H01L 25/0756; H01L 2924/17151; H01L 2924/19103;
(Continued)

(56) References Cited

U.S. PATENT DOCUMENTS

| 7,633,765 | B1 | 12/2009 | Scanlan et al. |
| 2014/0131858 | A1 | 5/2014 | Pan et al. |
| 2017/0032977 | A1* | 2/2017 | Chen ................... H01L 21/4857 |

FOREIGN PATENT DOCUMENTS

| CN | 103915413 | 7/2014 |
| CN | 103972191 | 8/2014 |

(Continued)

OTHER PUBLICATIONS

"Office Action of Taiwan Counterpart Application", dated Aug. 14, 2018, p. 1-p. 7.

*Primary Examiner* — Thanhha S Pham
(74) *Attorney, Agent, or Firm* — JCIPRNET

(57) ABSTRACT

A chip package structure including a substrate, a first chip, a frame, a plurality of first conductive connectors, a first encapsulant, and a package is provided. The first chip is disposed on the substrate. The first chip has an active surface and a back surface opposite to the active surface, and the active surface faces the substrate. The frame is disposed on the back surface of the first chip and the frame has a plurality of openings. The first conductive connectors are disposed on the substrate and the first conductive connectors are disposed in correspondence to the openings. The first encapsulant is disposed between the substrate and the frame and encapsulates the first chip. The package is disposed on the frame and is electrically connected to the substrate via the first conductive connectors.

18 Claims, 9 Drawing Sheets

(51) Int. Cl.

| | |
|---|---|
| *H01L 23/055* | (2006.01) |
| *H01L 23/28* | (2006.01) |
| *H01L 23/00* | (2006.01) |
| *H01L 21/56* | (2006.01) |
| *H01L 21/48* | (2006.01) |
| *H01L 23/31* | (2006.01) |
| *H01L 23/498* | (2006.01) |
| *H01L 25/10* | (2006.01) |
| *H01L 23/49* | (2006.01) |
| *H01L 23/50* | (2006.01) |
| *H01L 23/538* | (2006.01) |
| *H01L 25/065* | (2006.01) |
| *H01L 23/04* | (2006.01) |
| *H01L 23/433* | (2006.01) |

(52) U.S. Cl.
CPC ......... *H01L 21/4889* (2013.01); *H01L 21/56* (2013.01); *H01L 21/563* (2013.01); *H01L 21/565* (2013.01); *H01L 23/04* (2013.01); *H01L 23/3121* (2013.01); *H01L 23/3128* (2013.01); *H01L 23/4334* (2013.01); *H01L 23/49* (2013.01); *H01L 23/49811* (2013.01); *H01L 23/49816* (2013.01); *H01L 23/49827* (2013.01); *H01L 23/49833* (2013.01); *H01L 23/50* (2013.01); *H01L 23/5384* (2013.01); *H01L 24/03* (2013.01); *H01L 24/11* (2013.01); *H01L 24/27* (2013.01); *H01L 24/83* (2013.01); *H01L 24/97* (2013.01); *H01L 25/0657* (2013.01); *H01L 25/105* (2013.01); *H01L 23/49838* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/03* (2013.01); *H01L 2224/0401* (2013.01); *H01L 2224/04042* (2013.01); *H01L 2224/13023* (2013.01); *H01L 2224/13147* (2013.01); *H01L 2224/16227* (2013.01); *H01L 2224/16235* (2013.01); *H01L 2224/16237* (2013.01); *H01L 2224/2919* (2013.01); *H01L 2224/29139* (2013.01); *H01L 2224/32225* (2013.01); *H01L 2224/32245* (2013.01); *H01L 2224/45144* (2013.01); *H01L 2224/45147* (2013.01); *H01L 2224/48091* (2013.01); *H01L 2224/48227* (2013.01); *H01L 2224/48235* (2013.01); *H01L 2224/73253* (2013.01); *H01L 2224/73265* (2013.01); *H01L 2224/92225* (2013.01); *H01L 2225/1023* (2013.01); *H01L 2225/1035* (2013.01); *H01L 2225/1041* (2013.01); *H01L 2225/1058* (2013.01); *H01L 2225/1088* (2013.01); *H01L 2225/1094* (2013.01); *H01L 2924/1431* (2013.01); *H01L 2924/1433* (2013.01); *H01L 2924/1533* (2013.01); *H01L 2924/15311* (2013.01); *H01L 2924/181* (2013.01)

(58) Field of Classification Search
CPC ....... H01L 23/055; H01L 23/28; H01L 21/56; H01L 25/0657; H01L 23/3128; H01L 24/83; H01L 24/10; H01L 24/12; H01L 24/13; H01L 24/14; H01L 24/42; H01L 24/81; H01L 24/82; H01L 25/50; H01L 25/105; H01L 25/117
See application file for complete search history.

(56) References Cited

FOREIGN PATENT DOCUMENTS

| | | |
|---|---|---|
| CN | 105765711 | 7/2016 |
| TW | 201023308 | 6/2010 |

* cited by examiner

CHIP PACKAGE STRUCTURE AND MANUFACTURING METHOD THEREOF

CROSS REFERENCE TO RELATED APPLICATION

This application claims the priority benefit of U.S. provisional application Ser. No. 62/410,851, filed on Oct. 21, 2016. The entirety of the above-mentioned patent application is hereby incorporated by reference herein and made a part of specification.

BACKGROUND OF THE INVENTION

Field of the Invention

The invention relates to a chip package structure and a manufacturing method thereof, and more particularly, to a chip package structure having a frame and a manufacturing method thereof.

Description of Related Art

In recent years, electronic equipment and manufacturing techniques meeting increased market demand have been vigorously developed. In consideration of portability and the continuously growing demand of computers, communications products, and consumer electronic products, the traditional single-chip package structure has been failing to meet market demand. In other words, during product design, the characteristics of small and lightweight and high density need to be considered. As such, in view of the requirements for lightness, thinness, shortness, smallness, and compactness, integrated circuits (IC) with various functions are stacked in different manners for reducing dimensions and thickness of package products, which has become a mainstream strategy in the package market. Currently, packaging having a package-on-package (POP) structure are being developed to meet this trend.

However, in the manufacturing process of a stacked type package structure, different electronic devices often need to be electrically connected to one another via different mechanical equipment or processes. As a result, yield or reliability is often reduced. And throughput is reduced and production cost is increased. Therefore, further improvement of the yield of the package structure and the reliability of the product and reduce production cost is an important topic.

SUMMARY OF THE INVENTION

The invention provides a chip package structure having better yield or reliability and lower production cost.

The invention further provides a manufacturing method of a chip package structure that can have greater process window in manufacture, and can increase the throughput and/or yield of the chip package structure and reduce production cost of the chip package structure.

The invention provides a package structure including a substrate, a first chip, a frame, a plurality of first conductive connectors, a first encapsulant, and a package. The first chip is disposed on the substrate. The first chip has an active surface and a back surface opposite to the active surface, and the active surface faces the substrate. The frame is disposed on the back surface of the first chip and the frame has a plurality of openings. The first conductive connectors are disposed on the substrate and the first conductive connectors are disposed in correspondence to the openings. The first encapsulant is disposed between the substrate and the frame and encapsulates the first chip. The package is disposed on the frame and is electrically connected to the substrate via the first conductive connectors.

The invention provides a manufacturing method of a package structure. The method includes at least the following steps. A first chip is disposed on a substrate, wherein the first chip has an active surface and a back surface opposite to the active surface, and the active surface faces the substrate. A frame is disposed on the back surface of the first chip and the frame has a plurality of openings. A plurality of wires is formed on the substrate, and the plurality of wires passes through the plurality of corresponding openings. After the plurality of wires is formed, a first encapsulant is formed between the substrate and the frame to encapsulate the first chip. A portion of the plurality of wires is removed to form a plurality of first conductive connectors. A package is disposed on the frame, and the package is electrically connected to the substrate via the plurality of first conductive connectors.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
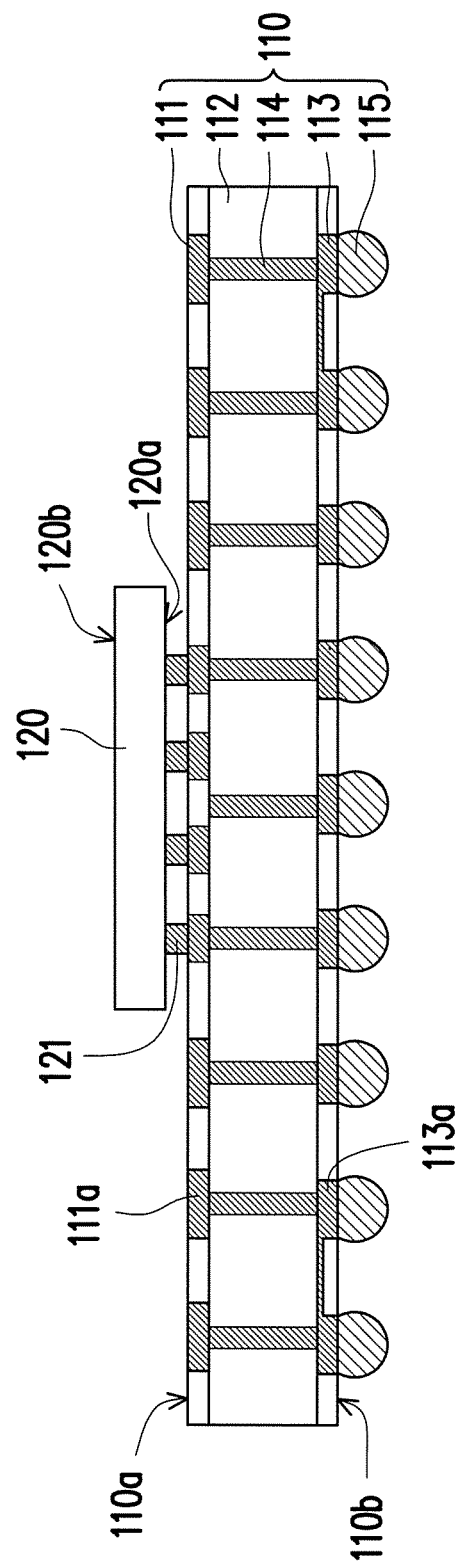
FIG. 1A to FIG. 1G are cross sections of the manufacturing method of a chip package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are cross sections of the manufacturing method of a chip package structure 100 according to an embodiment of the invention. Referring to FIG. 1A, a substrate 110 is provided. The substrate 110 may have a first surface 110a and a second surface 110b opposite to the first surface 110a. The substrate 110 may include a first circuit layer 111, a core layer 112, a second circuit layer 113, and a plurality of vias 114. The first circuit layer 111 is disposed on the first surface 110a, the second circuit layer 113 is disposed on the second surface 110b, and the first circuit layer 111 and the second circuit layer 113 may be electrically connected to each other through the vias 114 passing through the core layer 112. In some embodiments, the first circuit layer 111 may include a plurality of first pads 111a, and the second circuit layer 113 may include a plurality of second pads 113a. The first circuit layer 111 may be electrically connected to other electronic devices via the first pads 111a, and the second circuit layer 113 may be electrically connected to other electronic devices via the second pads 113a. In the present embodiment, the substrate 110 is a double-sided wiring board, but the invention is not limited thereto. In other embodiments, the substrate 110 may also be a multi-layered wiring board. When the substrate 110 is a multi-layered wiring board, at least two circuit layers 171 in the substrate 110 may be electrically connected through the conductive via(s).

Referring further to FIG. 1A, the first chip 120 is disposed on the substrate 110 and electrically connected to the substrate 110. The first chip 120 may be a die, a packaged chip, a stacked chip package, or an application-specific integrated circuit (ASIC), but the invention is not limited thereto. The first chip 120 has an active surface 120a facing the substrate 110 and a back surface 120b opposite to the active surface 120a. In the present embodiment, the first chip 120 may be flip-chip bonded (for example, through a plurality of connection terminal 121) to a portion of the first pads 111a disposed on the substrate 110, but the invention is not limited thereto. In some other embodiment, the first chip 120 may also be disposed inside the substrate 110 by a method such as a build-up method, a subtractive method or the like, which is not shown in the related figures of the specification of the invention.

In some embodiments, the substrate 110 may include a plurality of conductive terminals 115 disposed on the second pads 113a. The conductive terminals 115 may be solder balls, bumps, conductive pillars, or a combination thereof arranged in an array. The first chip 120 are configured electrically connect to external devices through the substrate 110 and the corresponding conductive terminals 115. However, the conductive material, structure, and forming method or forming shape of the conductive terminals 115 in the present embodiment are not limited.

Figure 1B:
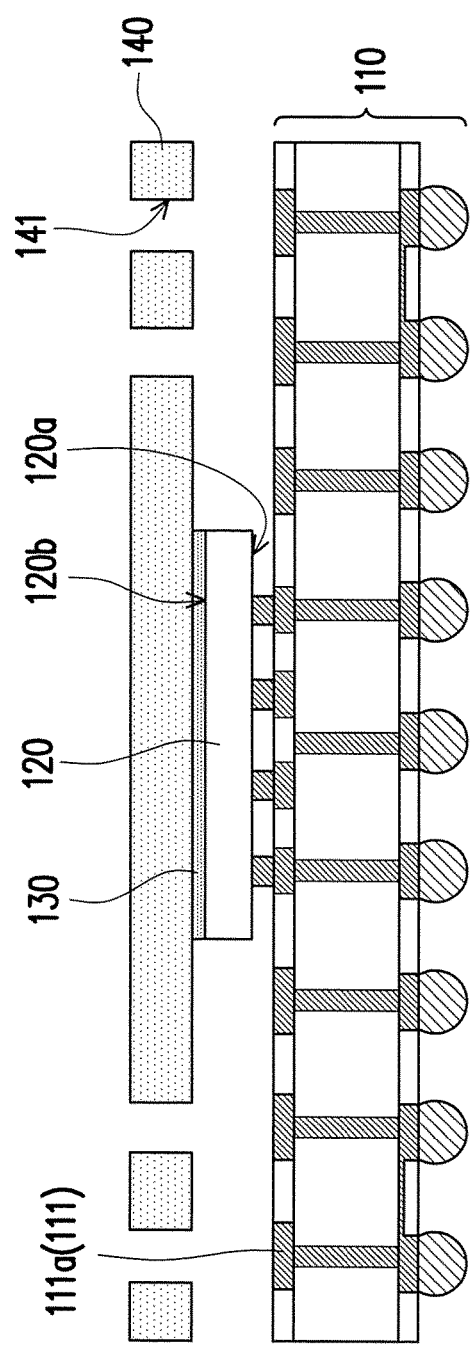
Figure 2:
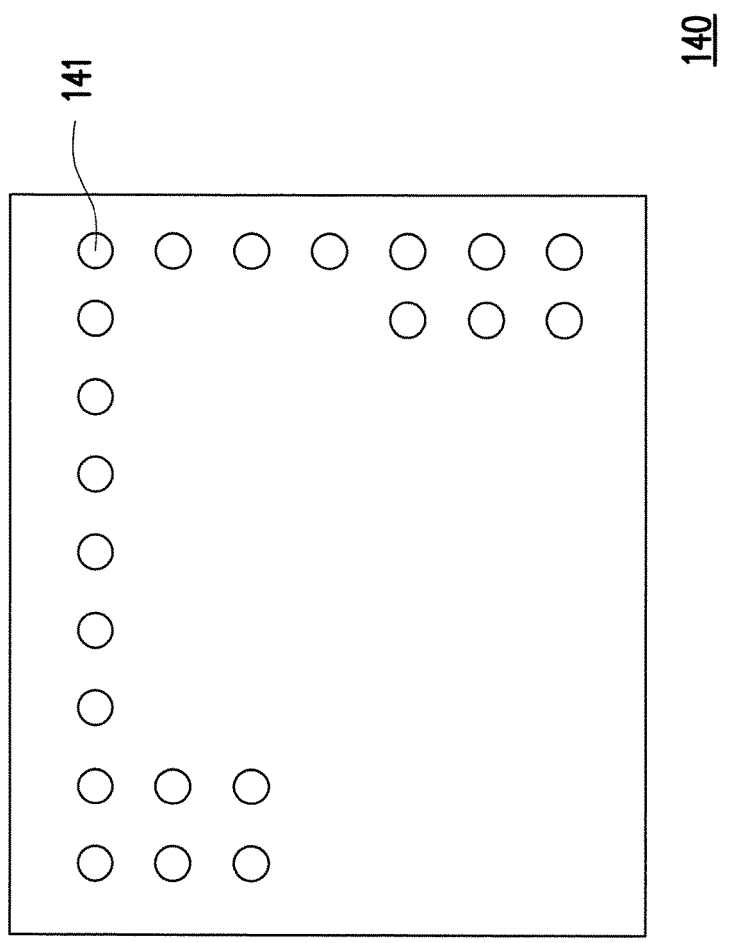
FIG. 2 is a top view of a frame according to an embodiment of the invention.

Referring to both FIG. 1B and FIG. 2, FIG. 2 is a top view of a frame according to an embodiment of the invention. After the first chip 120 is disposed on the substrate 110, the frame 140 is disposed on the back surface 120b of the first chip 120. The frame 140 has a plurality of openings 141. The openings 141 and the first chip 120 does not overlap each other. In the present embodiment, each of the openings 141 of the frame 140 may correspond to a first pad 111a. In the present embodiment, the frame 140 may be an insulator. As a result, even if a conductive device (such as the first conductive connectors 150 formed subsequently) located in the openings 141 is in contact with the frame 140, electrical connection between the frame 140 and other devices may still be prevented. In other embodiments, the exposed surface of the frame 140 may be an insulating material to prevent electric connection between the frame 140 and any conductive device due to contact.

In the present embodiment, the frame 140 may be adhered to the back surface 120b of the first chip 120 using an adhesive layer 130. The adhesive layer 130 may be a die-attached film (DAF), but the invention is not limited thereto.

Figure 1C:
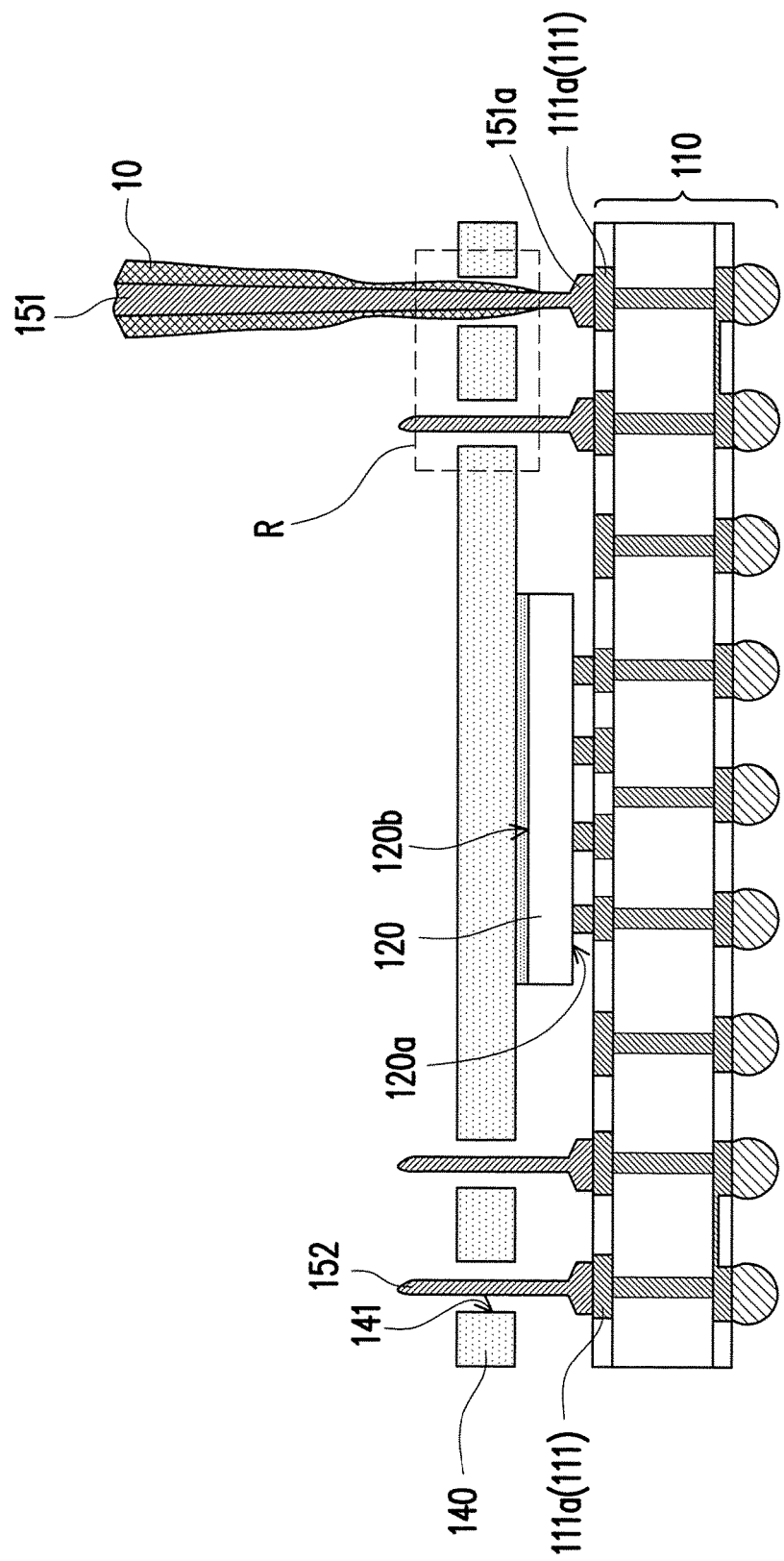
Figure 3:
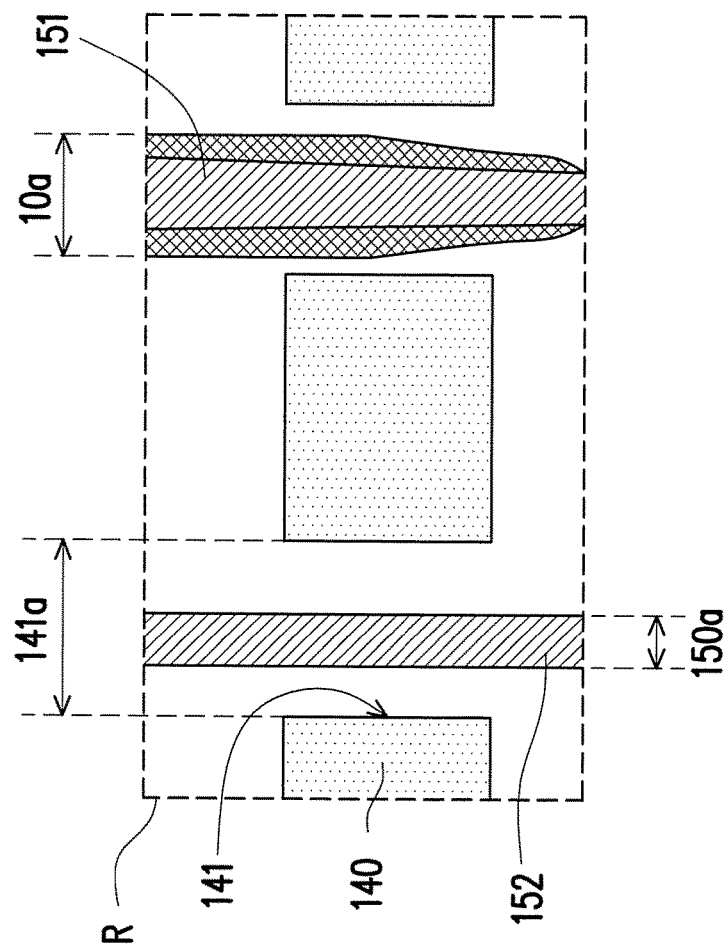
FIG. 3 is an enlarged view of region R in FIG. 1C.

Referring to both FIG. 1C and FIG. 3, FIG. 3 is an enlarged view of region R in FIG. 1C. After the frame 140 is disposed on the back surface 120b of the first chip 120, a plurality of wires 152 is formed on the substrate 110. A diameter 150a of each of the wires 152 is smaller than a diameter 141a of the opening 141 such that each of the wires 152 may pass through the corresponding opening 141 on the frame 140. In the present embodiment, the wires 152 may be coupled to a portion of the first pads 111a through wire bonding, but the invention is not limited thereto.

In the case of general wire bonding, a capillary 10 of a wire bonder (not fully shown) may first be extended into the corresponding opening 141. A capillary width 10a of the capillary 10 extended into the opening 141 is smaller than the diameter 141a of the opening 141. After the capillary 10 is extended into the corresponding opening 141, the conductive material 151 passes through the capillary 10. After the conductive material 151 that passed through the capillary 10 is pushed down and coupled to the corresponding first pad 111a, a connection terminal 151a of the conductive material 151 may be electrically connected to the first pad 111a on the substrate 110. The connection method may be thermocompression bonding, ultrasonic bonding, or thermosonic bonding, but the invention is not limited thereto. After the conductive material 151 and the first pad 111a are connected, the capillary 10 may be extended away from the substrate 110 and through the opening 141. In this way, the capillary 10 is raised for leading the conductive material 151 corning out of the capillary 10 and in order to form a shape of the bonding wire. After the capillary 10 is pulled out of the opening 141, the conductive material 151 coming out of the capillary 10 may be cut off to form a wire 152. By repeating the steps, a plurality of wires 152 may be formed. Each of the wires 152 passes through the corresponding opening 141 on the frame 140 and electrically connects to the corresponding first pad 111a.

In the wire bonding process, the capillary width 10a of the capillary 10 may be about 60 micrometers (μm), the diameter 141a of the corresponding opening 141 on the frame 140 may be about 75 μm, and the diameter 150a of the resulting wires 152 may be about 20 μm. However, the values of the capillary width 10a, the diameter 141a, and the diameter 150a are only exemplary. The present embodiment only requires that the diameter 141a of the openings 141 be greater than the capillary width 10a of the capillary 10 and the diameter 141a of the openings 141 be greater than the diameter 150a of the wires 152.

Figure 1D:
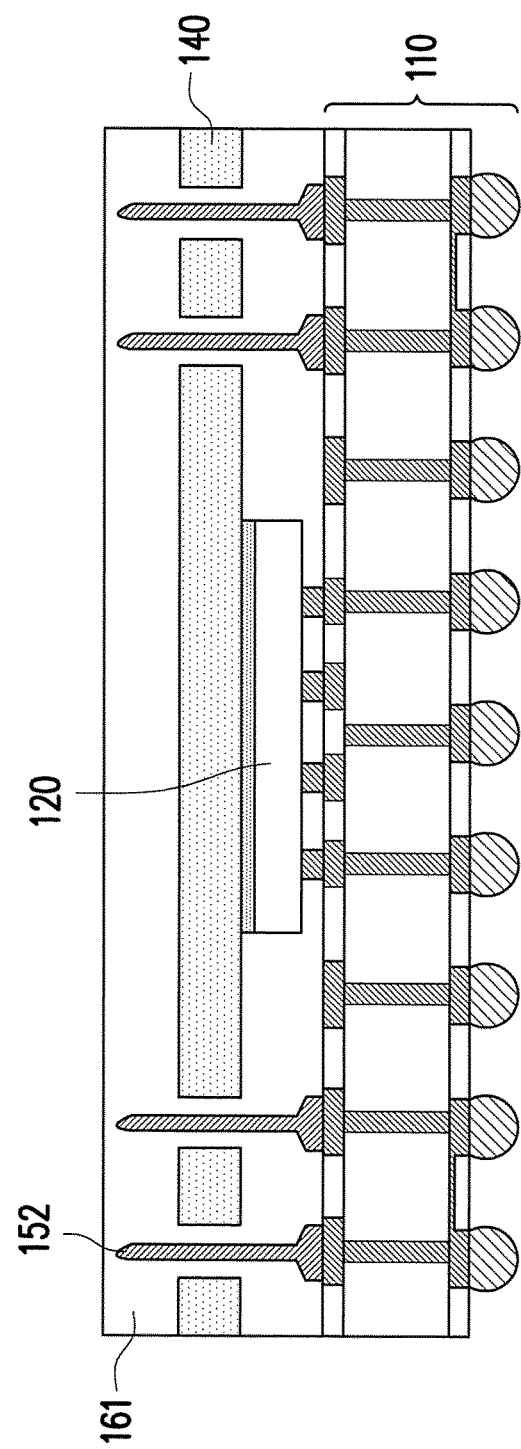

Referring to FIG. 1D, after the plurality of wires 152 is formed, a first encapsulating material 161 is formed on the substrate 110. In some embodiments, the first encapsulating material 161 may be formed by disposing a melted molding compound on the substrate 110 through a molding process or other suitable methods. Next, the melted molding compound is cured or cooled for curing. In the present embodiment, the first encapsulating material 161 is disposed on the substrate 110 and encapsulates the first chip 120, the frame 140, and the plurality of wires 152, but the invention is not limited thereto. In other embodiments, the first encapsulating material 161 may further encapsulate the frame 140. In other words, the first chip 120 is not exposed, and the wires 152 passing through the openings 141 may be positionally fixed by the first encapsulating material 161 filled in the openings 141.

Figure 1E:
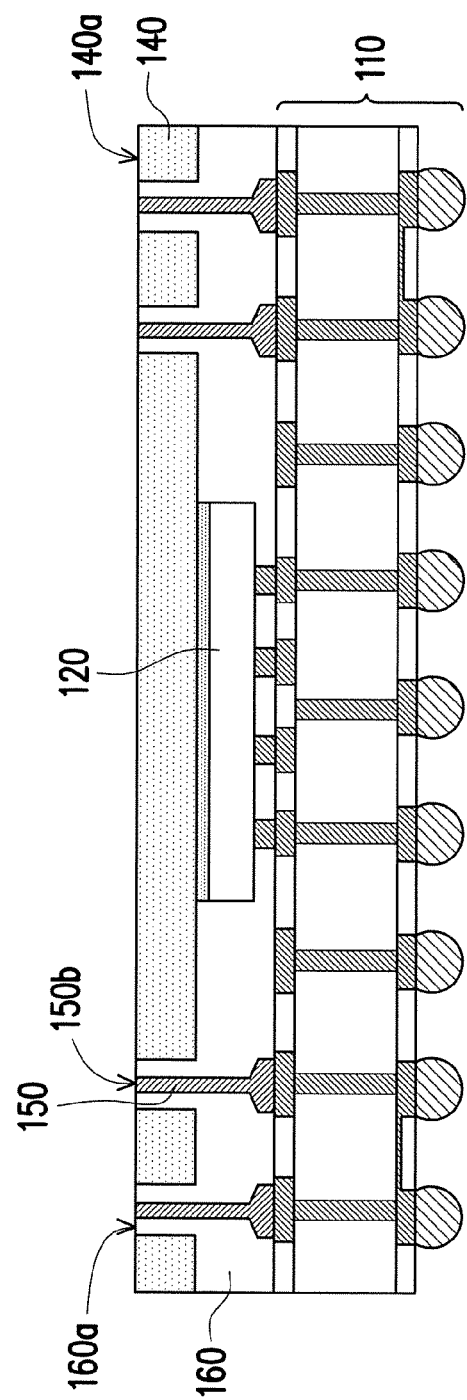

Referring to FIG. 1E, after the first encapsulating material 161 (shown in FIG. 1D) is formed. The portion of the wires 152 (shown in FIG. 1D) protruding beyond a frame surface 140a of the frame 140 may be removed using grinding, polishing, etching, or other suitable methods to form the first conductive connectors 150. As a result, a top surface 150b of the first conductive connectors 150 may be substantially coplanar with the frame surface 140a of the frame 140. According to above embodiments, the first conductive connectors 150 in the present embodiment may be stud bumps formed by a wire bonder. In other words, as compared with the diameter of the connection terminal 151a wherein the first conductive connectors 150 connected to the substrate 110, the diameter 150a of the portion which is away from the substrate 110 of first conductive connectors 150 is smaller.

In the present embodiment, when the first encapsulating material 161 further covers the frame surface 140a of the frame 140 (as shown in FIG. 1D), the portion of the first encapsulating material 161 covering the frame surface 140a of the frame 140 may also be removed to expose the frame 140 and the plurality of wires 152 to form the first encapsulant 160. In the present embodiment, the first encapsulating material 161 may be removed via a polishing process, etching process, or other suitable processes, but the invention is not limited thereto.

In other embodiments, when the first encapsulating material 161 is filled in the openings 141 but does not cover the frame surface 140a of the frame 140, the step of removing a portion of the first encapsulating material 161 may be omitted. The resulting first encapsulating material 161 is the first encapsulant 160.

In some embodiments, a planarization process may be performed on the first encapsulant 160, the frame 140, and/or the first conductive connectors 150, as such the frame surface 140a of the frame 140, an encapsulant surface 160a of the first encapsulant 160, and the top surface 150b of each of the first conductive connectors 150 are coplanar.

After the above-mentioned manufacturing process above, the manufacturing of a chip package 20 of this exemplary completes. The chip package 20 may include a substrate 110, a first chip 120, a frame 140, a plurality of first conductive connectors 150, and a first encapsulant 160. The first chip 120 is disposed on the substrate 100. The first chip has an active surface facing the substrate 110 and a hack surface 120b opposite to the active surface 120a. The frame 140 is disposed on the back surface 120b of the first chip 120. The frame 140 has a plurality of openings 141. The first conductive connectors 150 are disposed on the substrate 110 and in correspondence to the openings 141. The first encapsulant 160 is disposed between the substrate 110 and the frame 140 and encapsulates the first chip 120.

Figure 1F:
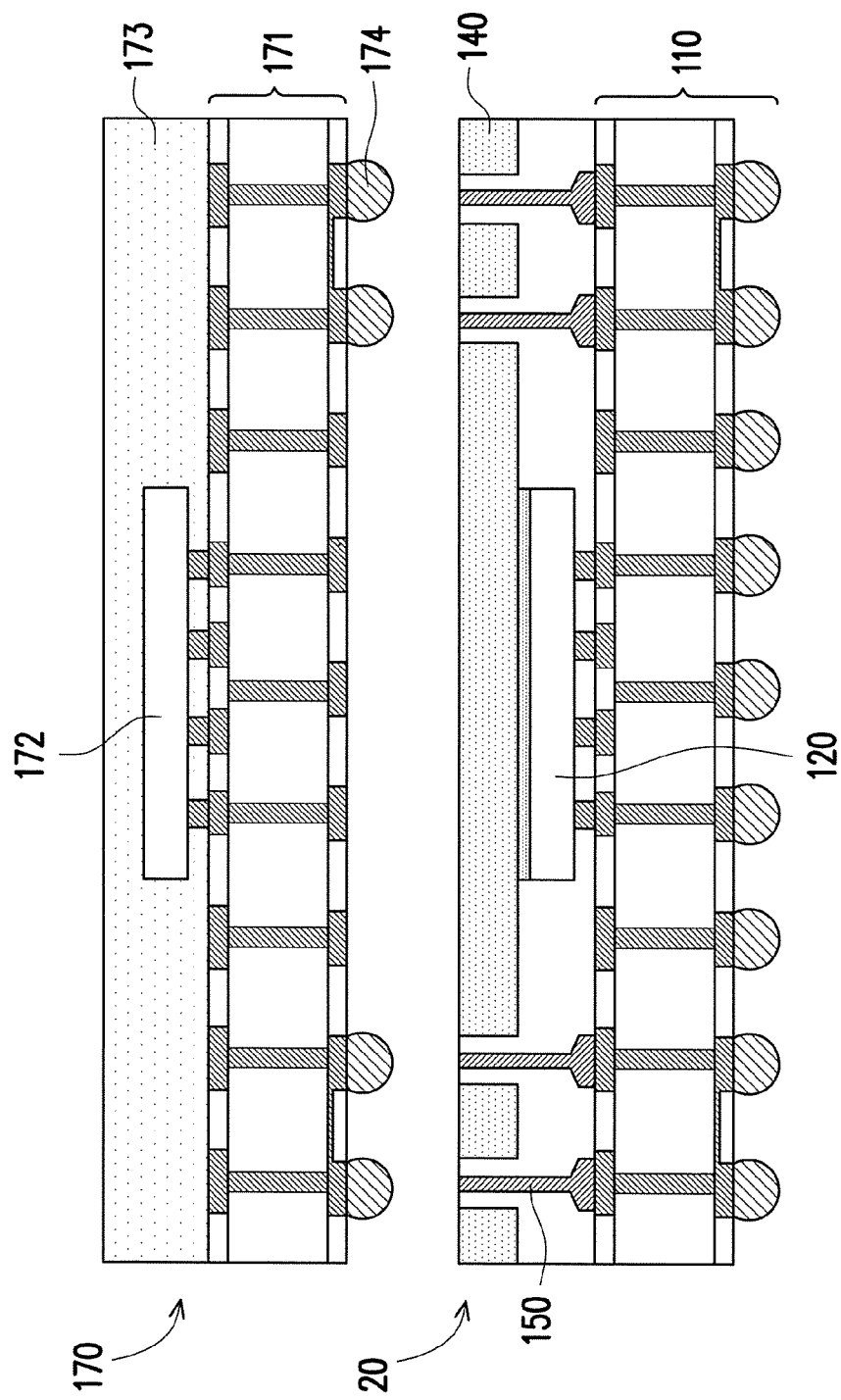

Referring to FIG. 1F, a package 170 is provided. The package 170 may include a circuit layer 171, a second chip 172, and a second encapsulant 173. The second chip 172 is disposed on the circuit layer 171 and electrically connected to the circuit layer 171. The second encapsulant 173 is disposed on the circuit layer 171 and encapsulates the second chip 172.

In the present embodiment, the second chip 172 may be flip-chip bonded to the circuit layer 171, but the invention is not limited thereto. In other embodiments, the second chip 172 may be electrically connected to the circuit layer 171 via wire bonding.

In the present embodiment, the circuit layer 171 may be a double-sided wiring board, but the invention is not limited thereto. In other embodiments, the circuit layer 171 may also be a multi-layered wiring board or be a redistribution layer (RDL).

In the present embodiment, the second chip 172 may be a die, a packaged chip, a stacked chip package, or an ASIC, but the invention is not limited thereto.

In the present embodiment, the package 170 may further include a plurality of second conductive connectors 174. The plurality of second conductive connectors 174 is disposed on the circuit layer 171 and opposite to the second chip 172. In other words, the circuit layer 171 is disposed between the plurality of second conductive connectors 174 and the second chip 172. The package 170 may be electrically connected to other devices via the second conductive connectors 174 through performing subsequent process. The second conductive connectors 174 are, for instance, solder balls, but the invention is not limited thereto.

Figure 1G:
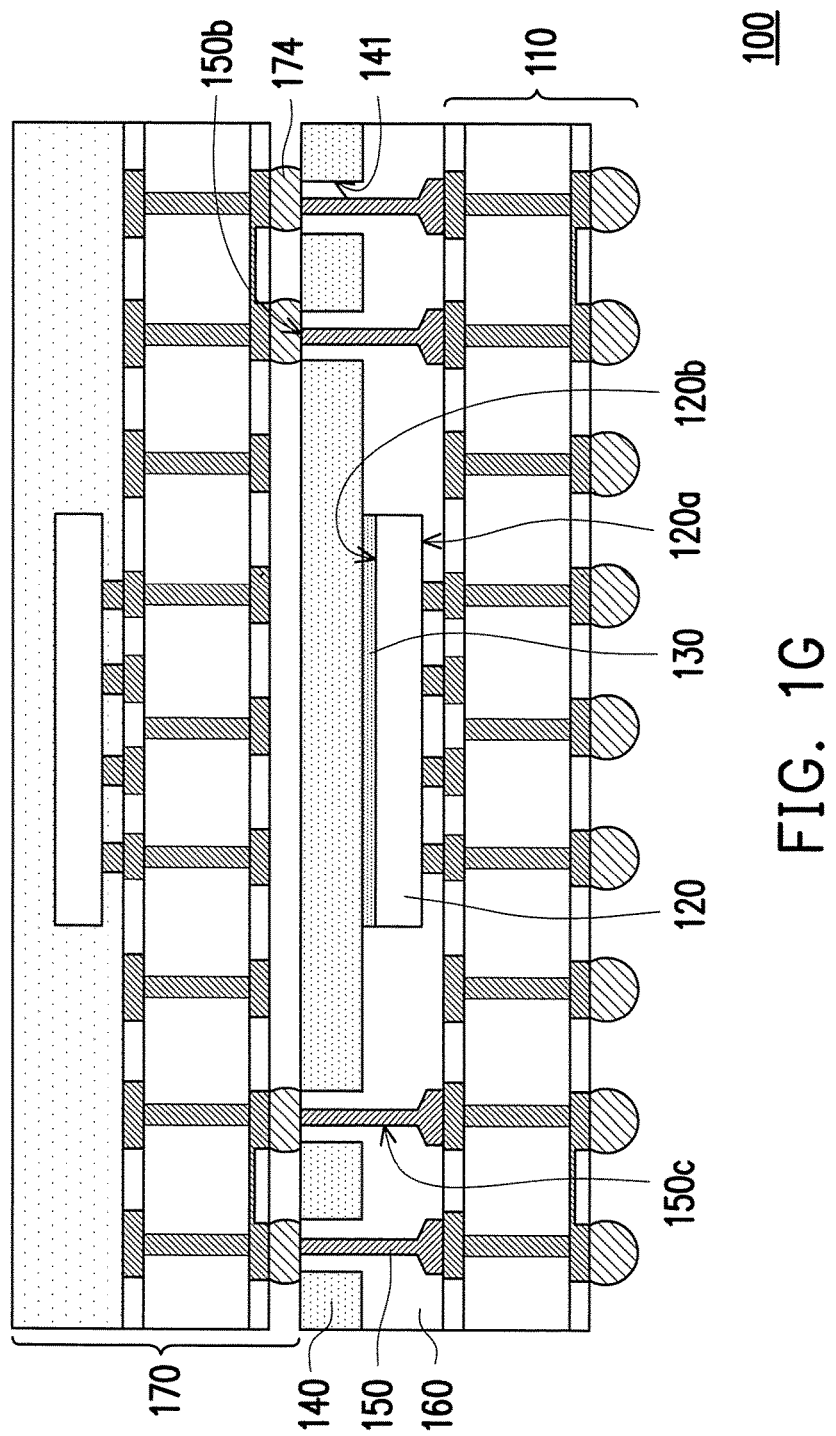

Referring to FIG. 1G, the package 170 is disposed on the chip package 20, and the package 170 is electrically connected to the substrate 110 via the plurality of first conductive connectors 150 to form a package-on-package (POP) chip package structure 100. For instance, each of the second conductive connectors 174 on the package 170 may be coupled to the corresponding first conductive connector 150 and configured to electrically connect to the second chip 172 in the package 170 to the substrate 110 through the circuit layer 171, the second conductive connectors 174, and the first conductive connectors 150.

The manufacturing of the chip package structure 100 of the present embodiment is substantially complete after the above process. The chip package structure 100 includes a substrate 110, a first chip 120, a frame 140, a plurality of first conductive connectors 150, a first encapsulant 160, and a package 170. The first chip 120 is disposed on the substrate 110. The first chip 120 has an active surface 120a and a back surface 120b opposite to the active surface 120a, and the active surface 120a faces the substrate 110. The frame 140 is disposed on the back surface 120b of the first chip 120 and the frame 140 has a plurality of openings 141. The first conductive connectors 150 are disposed on the substrate 110 and each of the first conductive connectors 150 is disposed with the corresponding opening 141. The first encapsulant 160 is disposed between the substrate 110 and the frame 140. The first encapsulant 160 encapsulates the first chip 120 and is in direct contact with a sidewall 150c of the first conductive connectors 150. The package 170 is disposed on the frame 140 and is electrically connected to the substrate 110 through the first conductive connectors 150.

In the present embodiment, the first conductive connectors 150 may be stud bumps formed using a wire bonder. The conductive material 151 (shown in FIG. 1C) forming the first conductive connectors 150 may be electrically connected to the substrate 110 before the first encapsulant 160 is formed. For a through mold via (TMV), a molding compound is generally formed first, then a through via is formed via laser drilling by a laser device. After forming the through via, a conductive substance can be fill into the through via by electroplating, deposition, or other similar methods, in such, a conductive via is formed. In comparison to the TMV technique, the present embodiment may omit laser drilling via a laser device to lower production cost. Alternatively, conductivity of the conductive vias is often reduced due to residual smear in the vias from etching, mechanical drilling, laser drilling, or other similar removal methods. Therefore, a desmear process is often needed in the general TMV technique. In the present embodiment, since the conductive material 151 forming the first conductive connectors 150 may be electrically connected to the substrate 110 before the first encapsulant 160 is formed, better conductivity may be achieved, and the removal process of the molding compound and the subsequent filling process of the conductive substance may be omitted to increase yield. Moreover, in comparison to preformed conductive pillars, the stud bumps formed by a wire bonder may have lower production cost, and therefore may have finer pitch. As a result, greater flexibility may be achieved in configuration.

In the present embodiment, in the manufacturing process of the chip package structure 100, each of the first conductive connectors 150 is formed by passing the wires 152 (FIGS. 1C and 1D) through the corresponding opening 141 of the frame 140 via a wire bonder and then removing the portion of the wires 152 protruding beyond a frame surface 140a of the frame 140. As a result, the frame 140 having the plurality of openings 141 may have a similar function to wire trimming to reduce undesired contact between adjacent wires 152 and/or first conductive connectors 150 to increase the yield or reliability of the chip package structure 100.

In the present embodiment, the frame 140 may be adhered to a back surface 120b of the first chip 120 via an adhesive layer 130. As a result, the frame 140 may be formed by a material having better thermal conductivity and/or an adhesive layer 130 having better thermal conductivity to improve the heat dissipation of the chip package structure 100.

In the present embodiment, the terminal of each of the first conductive connectors 150 away from the substrate 110 is located in the corresponding opening 141 of the frame 140, and a top surface 150b of the terminal away from the substrate 110 is exposed on the first encapsulant 160. Therefore, the second conductive connectors 174 on the package 170 only need to be aligned with and completely cover the corresponding opening 141 to be in contact with and electrically connected to the first conductive connectors 150. As a result, a greater process window may be provided in the configuration of the second conductive connectors 174 and/or the first conductive connectors 150, and the yield of the chip package structure 100 may be increased.

Based on the above, in the chip package structure of the present invention, the first conductive connectors may be formed by a wire bonder, and the conductive material forming the first conductive connectors may be electrically connected to the substrate before the first encapsulant is formed to achieve better conductivity and increase yield. Moreover, the first conductive connectors formed by a wire bonder may have lower production cost and may have finer pitch to achieve greater flexibility in configuration. Moreover, in the chip package structure of the present invention, since the frame has a plurality of openings, the yield or reliability of the manufacturing process of the chip package structure may be increased, and greater process window is provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
    a substrate;
    a first chip disposed on the substrate, wherein the first chip has an active surface and a back surface opposite to the active surface, and the active surface faces the substrate;
    a frame disposed on the back surface of the first chip, wherein the frame has a plurality of openings;
    a plurality of first conductive connectors disposed on the substrate, wherein the plurality of first conductive connectors are disposed in correspondence to the plurality of openings;
    a first encapsulant disposed between the substrate and the frame and encapsulating the first chip, wherein the first encapsulant fills the plurality of openings and exposes each of the plurality of first conductive connectors; and
    a package disposed on the frame and electrically connected to the substrate via the plurality of first conductive connectors.

2. The chip package structure of claim 1, wherein the first encapsulant directly covers a sidewall of each of the plurality of first conductive connectors.

3. The chip package structure of claim 1, wherein each of the plurality of first conductive connectors is a stud bump.

4. The chip package structure of claim 1, wherein a width of each of the plurality of first conductive connectors is smaller than a caliber of each of the plurality of openings.

5. The chip package structure of claim 1, wherein the frame is electrically insulated from the substrate, the first chip, the plurality of first conductive connectors, and the package.

6. The chip package structure of claim 1, wherein a frame surface of the frame, a top surface of each of the plurality of first conductive connectors, and an encapsulant surface of the first encapsulant are level.

7. The chip package structure of claim 1, wherein the plurality of openings of the frame and the first chip are not overlapped.

8. The chip package structure of claim 1, further comprising:
    an adhesive layer disposed between the first chip and the frame.

9. The chip package structure of claim 1, further comprising:
    a plurality of conductive terminals electrically connected to the substrate, wherein the substrate is disposed between the first chip and the plurality of conductive terminals.

10. The chip package structure of claim 1, wherein the package comprises:
    a circuit layer;
    a second chip disposed on the circuit layer and electrically connected to the circuit layer; and
    a second encapsulant disposed on the circuit layer and encapsulating the second chip.

11. The chip package structure of claim 10, wherein the package further comprises:
    a plurality of second conductive connectors, wherein the circuit layer is disposed between the plurality of second conductive connectors and the second chip, and each of the plurality of second conductive connectors completely covers the plurality of corresponding openings.

12. A manufacturing method of a chip package structure, comprising:
    disposing a first chip on a substrate, wherein the first chip has an active surface and a back surface opposite to the active surface, and the active surface faces the substrate;
    disposing a frame on the back surface of the first chip, wherein the frame has a plurality of openings;
    forming a plurality of wires on the substrate, wherein the plurality of wires passes through the plurality of corresponding openings;
    forming a first encapsulating material on the substrate, wherein the first encapsulating material fills the openings of the frame and is formed between the substrate and the frame to encapsulates the first chip, the frame, and the plurality of wires;
    removing a portion of the first encapsulating material and a portion of the plurality of wires to respectively form a first encapsulant and a plurality of first conductive connectors, wherein the first encapsulant exposes the frame and each of the first conductive connectors; and
    disposing a package on the frame, wherein the package is electrically connected to the substrate via the plurality of first conductive connectors.

13. The manufacturing method of the chip package structure of claim 12, wherein the plurality of wires is formed via a wire bonding method.

14. The manufacturing method of the chip package structure of claim 13, wherein the step of forming the plurality of wires comprises:
   extending a capillary into the plurality of corresponding openings;
   bringing the conductive material in contact with the substrate via the capillary; and
   extending the capillary supplying the conductive material out of the plurality of corresponding openings to form the plurality of corresponding wires.

15. The manufacturing method of the chip package structure of claim 12, further comprising:
   forming an adhesive layer on the back surface of the first chip, wherein the frame is adhered to the first chip via the adhesive layer.

16. The manufacturing method of the chip package structure of claim 12, further comprising:
   forming a plurality of conductive terminals on the substrate, wherein the plurality of conductive terminals is electrically connected to the substrate, and the substrate is disposed between the first chip and the plurality of conductive terminals.

17. The manufacturing method of the chip package structure of claim 12, wherein the package comprises:
   a circuit layer;
   a second chip disposed on the circuit layer and electrically connected to the circuit layer; and
   a second encapsulant disposed on the circuit layer and encapsulating the second chip.

18. The manufacturing method of the chip package structure of claim 17, wherein the package further comprises:
   a plurality of second conductive connectors, wherein the circuit layer is disposed between the plurality of second conductive connectors and the second chip, and each of the plurality of second conductive connectors completely covers the plurality of corresponding openings after the package is disposed on the frame.

* * * * *